United States Patent [19]
Chu

[11] Patent Number: 6,128,200
[45] Date of Patent: Oct. 3, 2000

[54] BUTT-JOINT CPU MOUNTING STRUCTURE

[76] Inventor: Ho-Kang Chu, 17639 Antonio Ave., Cerritos, Calif. 90703

[21] Appl. No.: 09/252,392

[22] Filed: Feb. 18, 1999

[30]     Foreign Application Priority Data

Feb. 18, 1998 [TW] Taiwan ................................. 87202334

[51] Int. Cl.[7] ..................................................... H05K 7/02
[52] U.S. Cl. ........................ 361/760; 361/765; 361/683; 174/52.1; 174/255; 174/260; 439/59; 439/62; 257/727; 257/713; 257/150
[58] Field of Search ..................................... 361/760, 765, 361/683, 686, 719, 695, 756, 727; 174/52.1, 255, 260; 439/62, 59; 257/727, 713, 150

[56]                References Cited

U.S. PATENT DOCUMENTS

| | | | |
|---|---|---|---|
| 5,155,663 | 10/1992 | HaRase | 361/684 |
| 5,528,459 | 6/1996 | Ainsbury et al. | 361/737 |
| 5,600,539 | 2/1997 | Heys, Jr. et al. | 361/684 |
| 5,650,917 | 7/1997 | Hsu | 361/759 |
| 5,710,693 | 1/1998 | Tsukada et al. | 361/686 |
| 5,726,865 | 3/1998 | Webb et al. | 361/801 |

*Primary Examiner*—Jeffrey Gaffin
*Assistant Examiner*—David Foster

[57]                 ABSTRACT

A butt-joint CPU mounting structure includes a connector having two opposite faces. Each face has a receiving slot disposed therein adapted to respectively and receivingly engage with a CPU module and an edge of a main board of a computer thereby connecting the CPU module to the main board. The receiving slots are arranged in alignment with each other whereby the CPU module is substantially coplanar with the main board. A CPU holder includes two support members each defining a channel for receiving opposite side flanges of the connector. Bolts are used to secure the support members to the side flanges of the connector. The CPU module is received between the two support members whereby opposite edges of the CPU module are engaged and supported by the support members. A connection member is connected between the two support members for strengthening the mechanical structure thereof. The support members are provided with bolt holes through which bolts extend for engaging with a housing of the computer.

7 Claims, 5 Drawing Sheets

BUTT-JOINT CPU MOUNTING STRUCTURE

BACKGROUND OF THE INVENTION

1. Field of the Invention

The present invention generally relates to a mounting structure for mounting a central processing unit (CPU) module to a main board, and in particular to a CPU mount for mounting a CPU module to a main board in a butt joint manner whereby the CPU module is substantially coplanar with the main board thereby reducing the height required to accommodate the CPU module.

2. The Prior Art

As computers continue to be miniaturized to meet the demands of the electronic market, CPU chips are becoming increasingly integrated with the associated circuit to form a CPU module and promote space conservation. The main board of the computer is provided with a mount to connect the CPU module thereto. FIG. 1 of the attached drawings shows an example of a CPU mount that is available in the market. The CPU mount 70 is fixed on a main board and comprises two upright support members (not labeled) which are substantially normal to the main board and spaced from each other for receiving a CPU module 50 therebetween. The support members engage with opposite edges of the CPU module 50 thereby fixing the CPU module 50 on the main board. Such an arrangement, however, requires a significant amount of space above the main board to accommodate the CPU module 50 thereby hindering computer miniaturization.

Furthermore, the CPU module 50 requires heat dissipation in order to maintain a proper working temperature. Thus, a heat dissipator 60 comprising heat dissipating fins (not labeled) is usually attached to one side of the CPU module 50 for removing heat generated by the CPU. The heat dissipator 60 has a substantial weight which causes the heat dissipator 60 to become offset from a central plane of the CPU module 50 resulting in a torque load acting on the support members of the CPU mount 70. Such a load may adversely affect the electrical engagement between the CPU module and the CPU mount thereby leading to malfunction of the computer.

Thus, it is desirable to have a CPU module mount structure which overcomes the problems discussed above.

SUMMARY OF THE INVENTION

Accordingly, an object of the present invention is to provide a butt-joint CPU mounting structure which connects the CPU module to a main board of a computer in a butt joint fashion whereby the CPU module is substantially coplanar with the main board resulting in a significant reduction of the overall height required to mount the CPU module to the main board.

Another object of the present invention is to provide a butt-joint CPU mounting structure which is secured to a housing of a computer thereby strengthening the mounting support of the CPU module on a main board of a computer.

To achieve the above objects, in accordance with the present invention, there is provided a butt-joint CPU mounting structure comprising a connector having two opposite faces. Each face has a receiving slot disposed therein adapted to respectively and receivingly engage with a CPU module and an edge of a main board of a computer thereby connecting the CPU module to the main board. The receiving slots are arranged in alignment with each other whereby the CPU module is substantially coplanar with the main board. A CPU holder includes two support members each defining a channel for receiving opposite side flanges of the connector. Bolts are used to secure the support members to the side flanges of the connector. The CPU module is received between the two support members whereby opposite edges of the CPU module engage with and are supported by the support members. A connection member is connected between the two support members for strengthening the mechanical structure thereof. The support members are provided with bolt holes through which bolts extend for engaging with a housing of the computer.

BRIEF DESCRIPTION OF THE DRAWINGS

The present invention will be apparent to those skilled in the art after reading the following description of the preferred embodiments thereof, with reference to the accompanying drawings, in which.

DETAILED DESCRIPTION OF THE PREFERRED EMBODIMENTS

Figure 1:
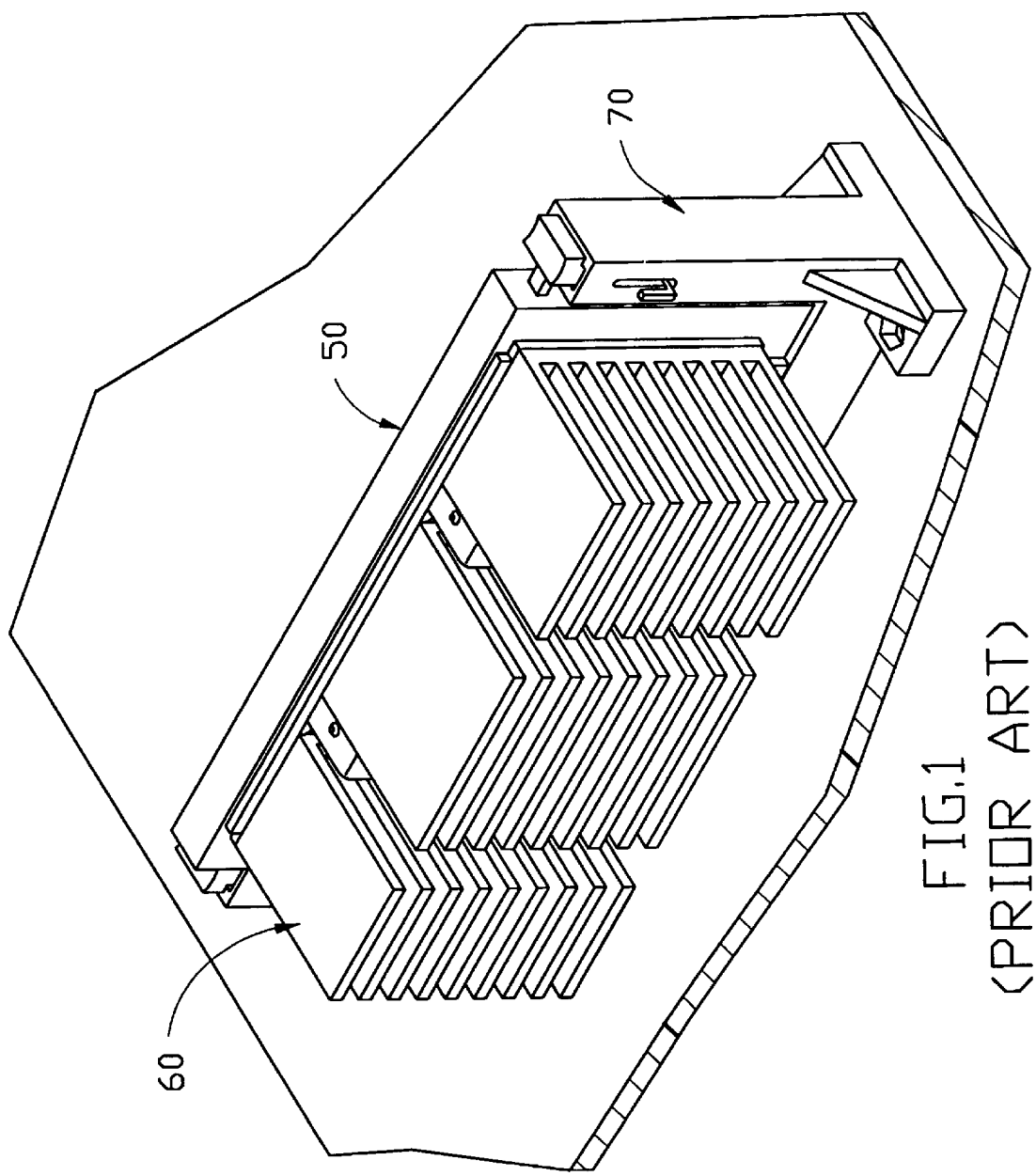
FIG. 1 is a perspective view showing a conventional CPU mount connecting a CPU module to a main board of a computer.
Figure 2:
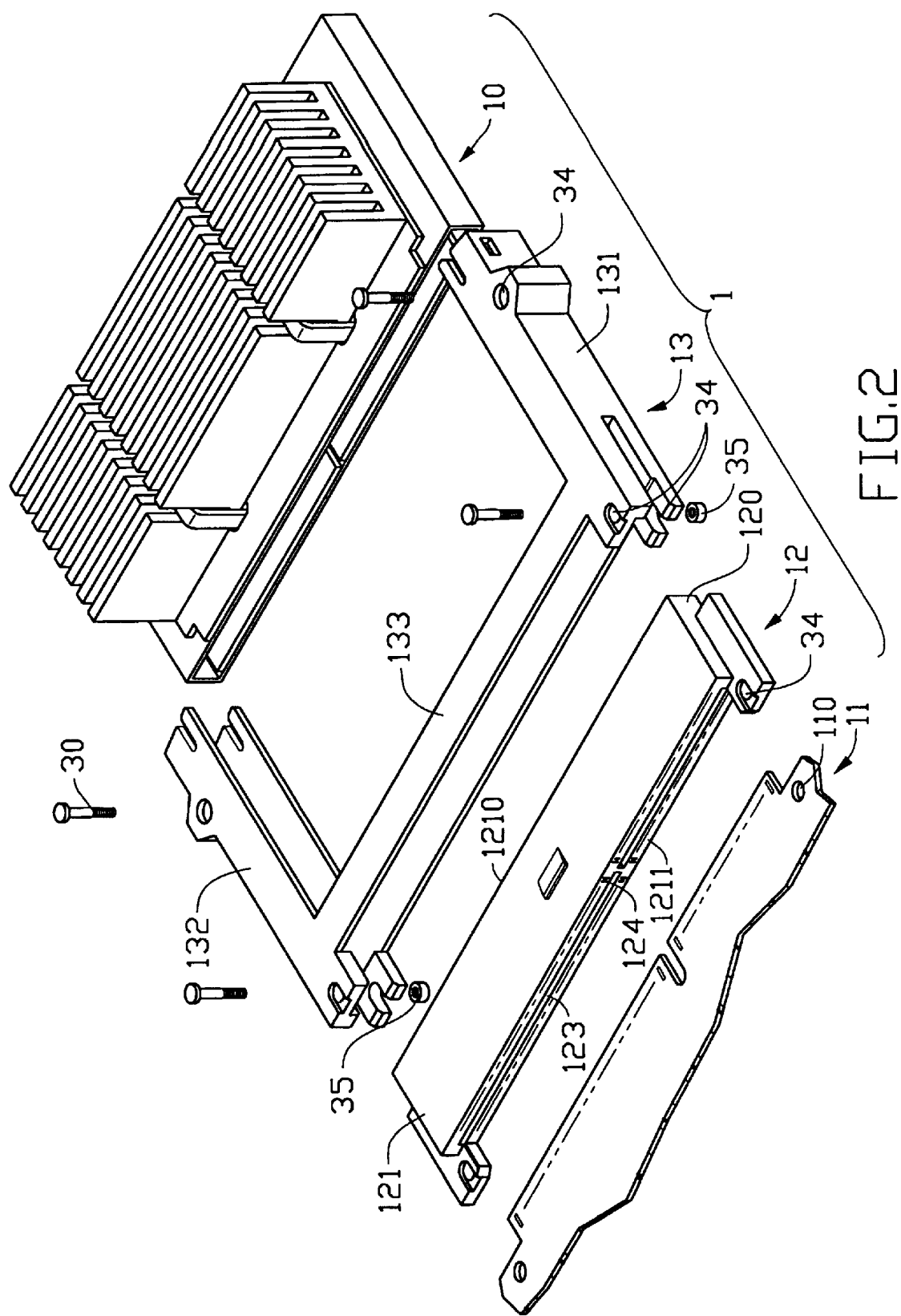
FIG. 2 is an exploded view of a butt-joint CPU mount constructed in accordance with the present invention and a CPU module connected by the CPU mount to a main board of a computer of which only a portion is shown.
Figure 3:
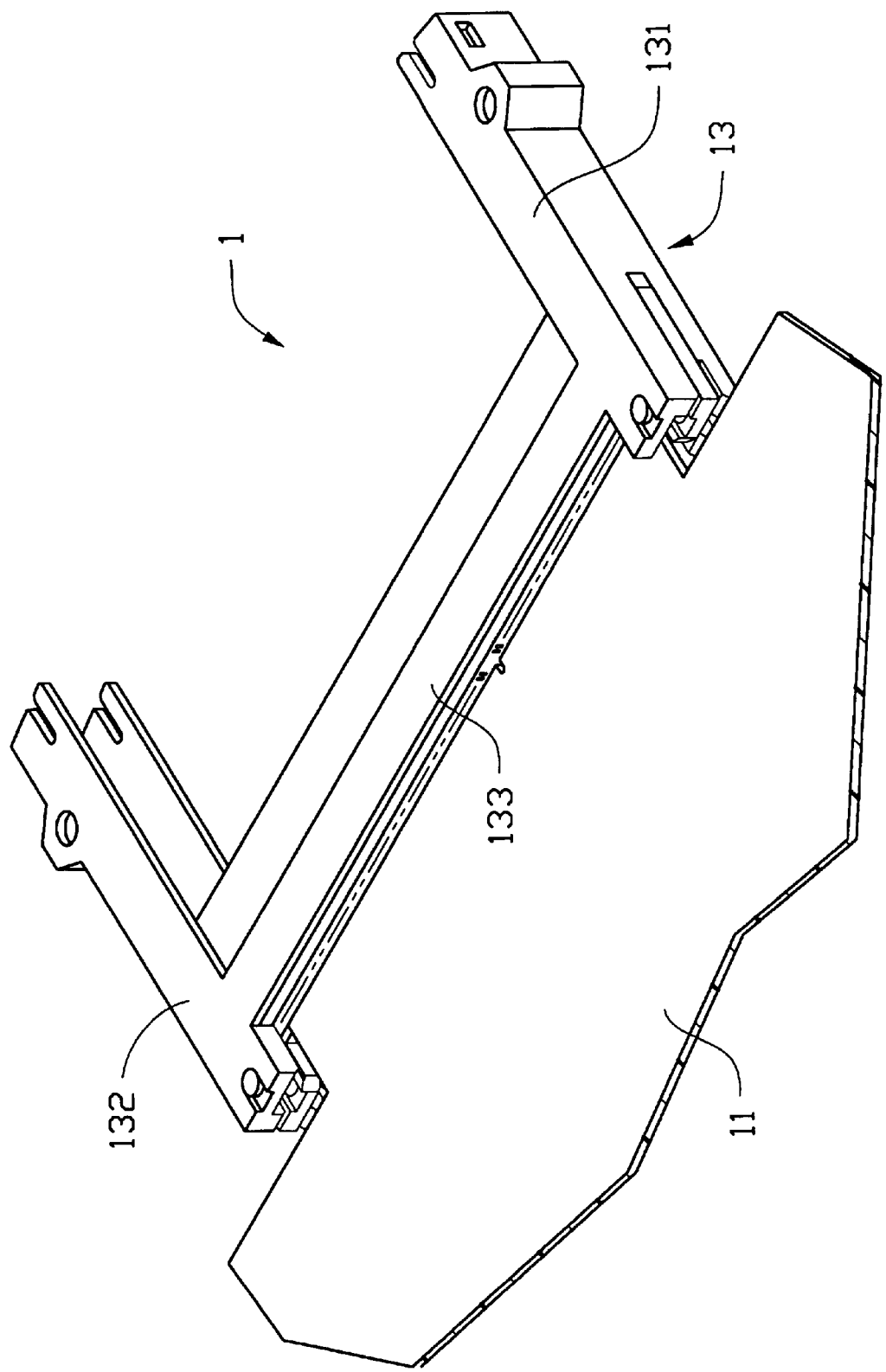
FIG. 3 is a perspective view of the butt-joint CPU mount of the present invention mounted on the main board.
Figure 4:
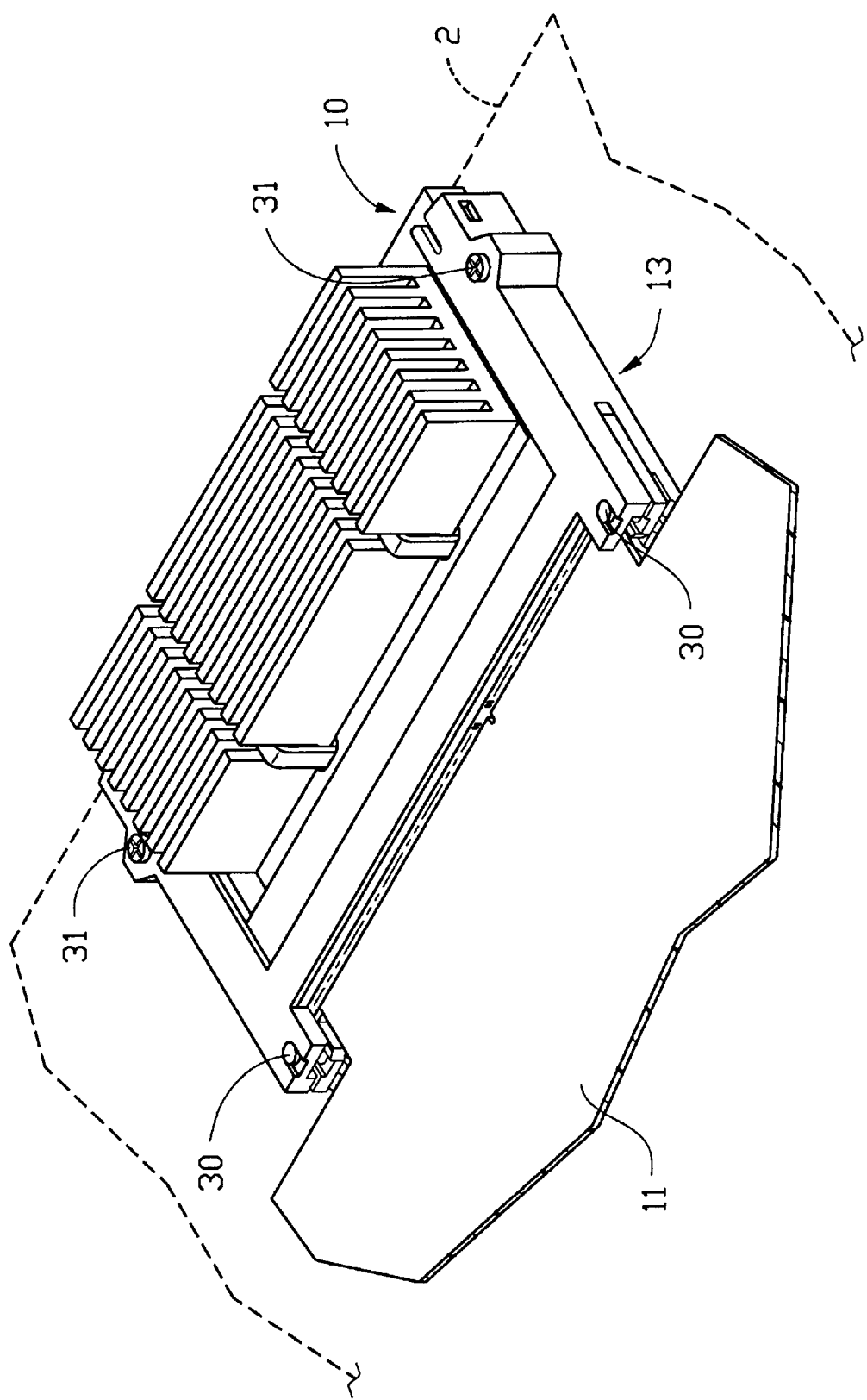
FIG. 4 is a perspective view of the butt-joint CPU mount of the present invention mounting the CPU module to the main board and being fixed to a housing of the computer.

With reference to the drawings and in particular to FIGS. 2–4, wherein a butt-joint CPU mount constructed in accordance with the present invention, generally designated with reference numeral 1, is shown, the CPU mount 1 connects a CPU module 10 to a main board 11 of a computer. The CPU mount 1 comprises a connector 12 and a CPU holder 13. The connector 12 comprises an insulative casing 121 having a first face 1210 and a second face 1211 opposite each other. Each of the faces 1210, 1211 has a receiving slot 123 disposed therein whereby the receiving slots 123 are substantially aligned with each other. A plurality of channels 124 are defined in the connector 12 between the receiving slots 123. The slots 123 receive a connection section of the CPU module 10 and an edge of the main board 11, respectively. Conductive means (not shown) is provided with the channels 124 to establish electrical connection between the CPU module 10 and the main board 11.

Due to the alignment of the receiving slots 123 on the first and second faces 1210, 1211 of the connector 12, the CPU module 10 is substantially coplanar with the main board 11 when connected thereto by means of the connector 12. For a flat main board 11, the CPU module 10 would also be coplanar with other portions of the main board 11.

The CPU holder 13 comprises two support members 131, 132, each defining a channel facing and spaced from each other for receiving a corresponding side flange of the connector 12. Fasteners, such as bolts 30, extend through holes 34 defined in the support members 131, 132 and the side flanges of the connector 12 to engage with nuts 35 (only shown in FIG. 2) for securing the CPU holder 13 to the connector 12. If desired, the bolts 30 may also extend through holes 110 defined in the main board 11 to more securely fix the CPU module 10 thereto.

The CPU module 10 is received between the two support members 131, 132 and retained thereby. Preferably, a connection member 133 is provided to connect the two support members 131, 132 together thereby strengthening the mechanical structure thereof.

As shown in FIG. 4, the support members 131, 132 may be provided with holes for receiving bolts 31 therein to engage with a housing 2 of the computer for more securely retaining the CPU module 10 in position.

Figure 5:
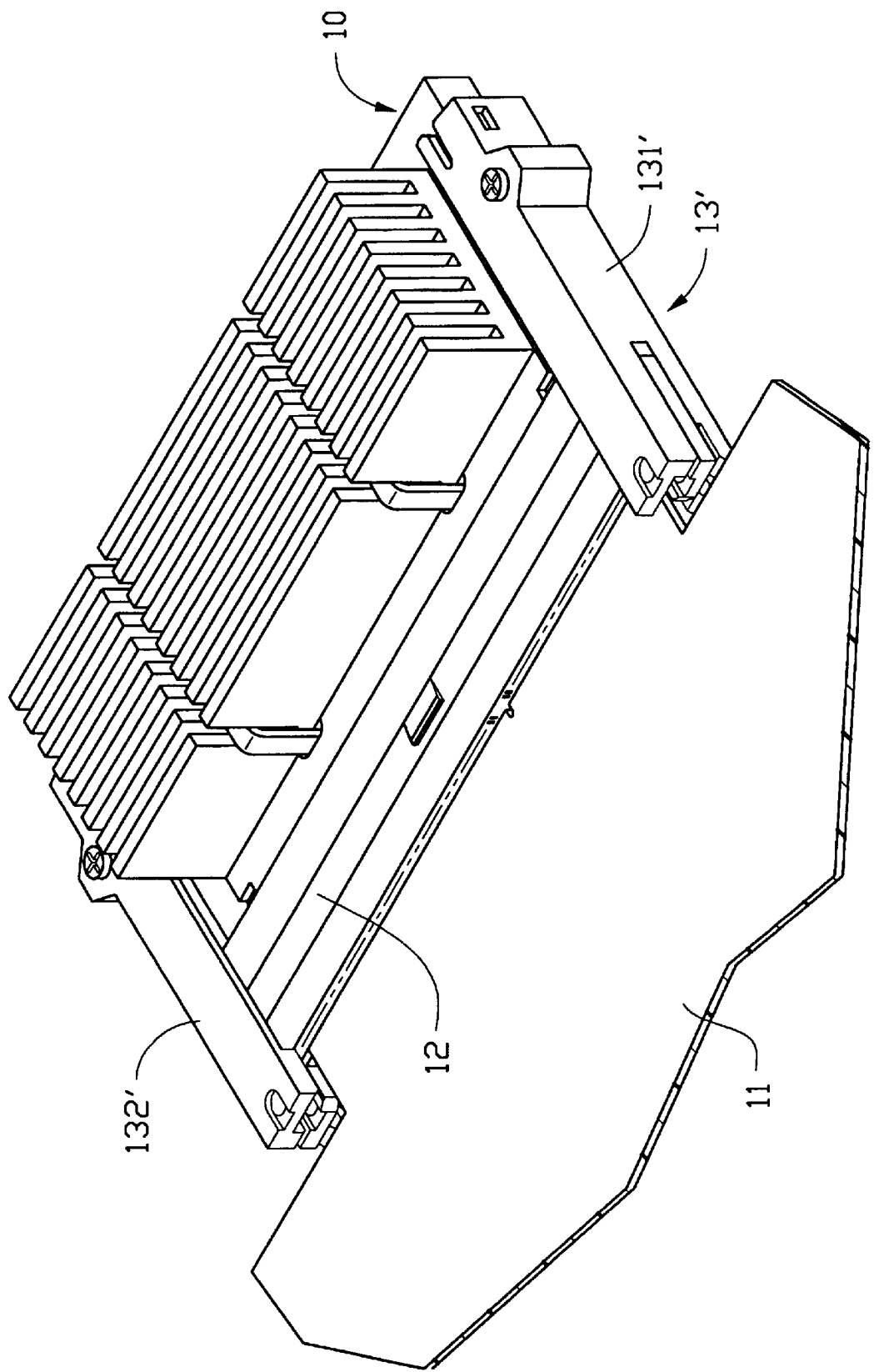
FIG. 5 is a perspective view of a butt-joint CPU mount in accordance with a second embodiment of the present invention connecting a CPU module to a main board of a computer.

In the embodiment illustrated in FIGS. 2–4, the support members 131, 132 of the CPU holder 13 are connected by means of a connection member 133. The connection member 133, however, is optional, and, as shown in FIG. 5 which illustrates a second embodiment of the present invention, the support members 131', 132' of the connector 13' are individually fixed to the connector 12 thereby providing a function similar to the first embodiment for connecting the CPU module 10 to the main board 11 in a coplanar fashion.

Although the present invention has been described with reference to the preferred embodiments thereof, it is apparent to those skilled in the art that there are a variety of modifications and changes that may be made without departing from the scope of the present invention which is intended to be defined by the appended claims.

What is claimed is:

1. A CPU mounting structure comprising a connector having two opposite faces, each face having a receiving slot disposed therein adapted to respectively receive and engage with a CPU module and an edge of a main board of the computer, the receiving slots being arranged in alignment with each other whereby the CPU module is substantially coplanar with the main board.

2. The CPU mounting structure as claimed in claim 1 further comprising two support members each defining a channel for receiving opposite side flanges of the connector, and first fastening for securing the support members to the side flanges of the connector, the CPU module being received between the two support members wherein opposite edges of the CPU module are engaged and supported by the channels of the support members.

3. The CPU mounting structure as claimed in claim 2, wherein the first fastening means comprises first bolts extending through first holes defined in each of the support members and the side flanges of the connector.

4. The CPU mounting structure as claimed in claim 2 further comprising connection means connecting the two support members together.

5. The CPU mounting structure as claimed in claim 1 further comprising second fastening means for fixing the support members to an external fixture for more securely supporting the CPU module on the main board.

6. The CPU mounting structure as claimed in claim 5, wherein the second fastening means comprises second bolts extending through second holes defined in the support members and engaging with the external fixture.

7. An assembly comprising a CPU module holder including a pair of horizontally extending support members, a CPU module horizontally received between said pair of support members, a horizontally extending connector retained to said holder and defining two opposite slots, a main board horizontally extending opposite to said pair of support members and including an edge received within one of said slots, and said CPU module including a connection section received within the other of said slots.

* * * * *